United States Patent [19]

Okada et al.

[11] 3,868,639

[45] Feb. 25, 1975

[54] REMOTE CONTROL RECEIVER RESPONSIVE TO SOUND

[75] Inventors: Hisao Okada, Yokohama; Tadashi Sato, Tokyo, both of Japan

[73] Assignees: Sony Corporation, Shinogawa-ku, Tokyo, Japan

[22] Filed: Oct. 17, 1972

[21] Appl. No.: 298,383

[30] Foreign Application Priority Data

Oct. 18, 1971 Japan .............................. 46-82292

[52] U.S. Cl. .......... 340/148, 340/171 R, 340/167 A

[51] Int. Cl. .......................... H04q 1/18, H04q 1/45

[58] Field of Search ............ 340/148, 171 R, 171 A, 340/167 A; 328/111 X; 325/473, 482

[56] References Cited

UNITED STATES PATENTS

| | | | |
|---|---|---|---|
| 3,266,021 | 8/1966 | Druz .............................. | 340/171 R |
| 3,277,311 | 10/1966 | Merlen .............................. | 328/111 X |
| 3,299,404 | 1/1967 | Yamarone .............................. | 340/171 R |
| 3,355,709 | 11/1967 | Hanus .............................. | 340/171 X |
| 3,413,608 | 11/1968 | Benzuly .............................. | 340/171 R |

*Primary Examiner*—Harold I. Pitts

*Attorney, Agent, or Firm*—Lewis H. Eslinger; Alvin Sinderbrand

[57] ABSTRACT

An ultrasonic remote control receiver having an amplifier whose gain is automatically controlled in response to the peak amplitude of an amplified electrical signal representative of the received sound signal and a level detecting circuit for producing control pulses in response to the portions of the amplified electrical signal which, after rectification, smoothing and integration with respect to time, exceed a predetermined voltage level.

7 Claims, 17 Drawing Figures

REMOTE CONTROL RECEIVER RESPONSIVE TO SOUND

BACKGROUND OF THE INVENTION

The present invention relates to a remote control device for use with the television receiver, and more particularly to an ultrasonic remote control device.

One method of remotely controlling a television receiver is by using a handheld ultrasonic transmitter to transmit sound signals to an ultrasonic receiver mounted in the television set. The transmitter and receiver operate on a plurality of ultrasonic frequencies to adjust the sound volume, the color balance, to change channels, and to turn the television set on and off, for example. The transmitter unit typically contains an electronic oscillator which operates an electro-acoustic transducer to produce the ultrasonic sound wave in the 40 KHz region, for example.

One problem of such systems is that the ultrasonic receiver also intercepts noise signals in the same frequency range which cause the T.V. set controls to change in an undesirable fashion. Common sources of such noise signals are the sounds of a telephone bell, musical instruments or even a squeaking door. Such noise signals generally are of short duration and have an amplitude which varies greatly. In contrast, the control signals are generally of a predetermined duration, which is selected by the operator of the transmitter in some systems, and have a substantially constant amplitude.

In prior ultrasonic remote control circuits the receiver unit contains a electro-acoustic transducer which receives the signals and these signals are amplified and passed through a bandpass filter, a rectifier and a voltage level detector circuit to provide a control pulse. The amplifier generally used in such circuits does not have an automatic gain control but instead is operated with a sufficiently high gain that in addition to amplifying it acts as a signal limiter. Thus noise signals having large amplitude variations might have the same voltage amplitude as the control signals after being amplified.

SUMMARY OF THE INVENTION

The above and other disadvantages are overcome by a preferred embodiment of the present invention of signals generated by a remote transmitter and having at least one predetermined frequency, comprising electro-acoustic transducer means for converting the transmitted sound signals into electrical signals, variable gain means for amplifying the electrical signals, and means responsive to a peak amplitude of the amplified electrical signals for controlling the gain of the variable gain amplifying means, thereby clamping the peak amplitude of the amplified electrical signals at a first predetermined voltage level. Direct current pulse signals are provided by means responsive to the amplified electrical signals which detect and smooth the amplified electrical signals. The duration of each direct current pulse signal is representative of the duration of the separate portions of the amplified electrical signals which have amplitudes above a second predetermined voltage level. An additional circuit integrates each of these direct current pulse signals with respect to time. An output control circuit responsive to the integrated direct current pulse signals produces output control signals representative of each integrated direct current pulse signal whose amplitude exceeds a third predetermined voltage level.

In one preferred embodiment the variable gain means comprises a variable gain amplifier and the gain control means varies the gain of the amplifier substantially inversely in proportion to the peak amplitude value of each amplified electrical signal. The gain control means is designed to provide substantially instantaneous negative feedback control up to the peak amplitude level of each amplified electrical signal. From that point of the feedback control has a slow response so that the variable gain amplifier operates with an approximately constant gain for the portion of the amplified electrical signal whose amplitude is less than the peak value.

In one embodiment only a single control signal is received and detected while in another embodiment a plurality of sound control signals at different frequencies are converted into amplified electrical signals which are then passed to a plurality of bandpass filters for separating the amplified electrical signals into their different frequencies and for supplying them to separate control channels. Each of the channels is provided with a separate detector and a separate output control signal producing circuit responsive to each of the detector circuits. In this second embodiment each of the separate channels is additionally provided with a feed forward control which is responsive to the duration of the detected amplified electrical signals for controlling the output control signal producing circuit. If the received signals are not of a predetermined time duration then the output signals from the output control signal producing circuit are blocked.

It is therefore an object of the present invention to prevent noise signals from interfering with the operation of an ultrasonic signal receiver.

It is another object of the invention to provide an ultrasonic control signal receiver which eliminates noise signals by sensing the variation in amplitude of such noise signals.

It is still another object of the invention to provide an ultrasonic control signal receiver which additionally eliminates noise signals by sensing the time duration of such noise signals.

The foregoing and other objectives, features, and advantages of the invention will be more readily understood upon consideration of the following detailed description of certain preferred embodiments of the invention, taken in conjunction with the accompanying drawings.

DESCRIPTION OF CERTAIN PREFERRED EMBODIMENTS

Figure 1:
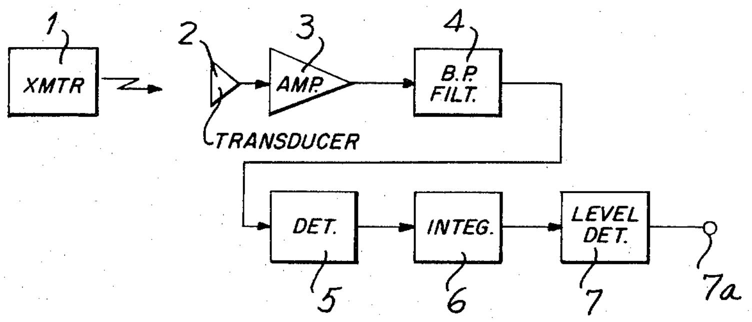
FIG. 1 is a block diagram of a typical prior art ultrasonic remote control system.

Referring now more particularly to FIG. 1 there is shown a block diagram of a prior art ultrasonic remote control system. Ultrasonic signals, in the range of 40 KHz for example, are generated by a remote transmitter 1. These sound signals are received by an electro-acoustic transducer 2 which converts the sound signals into electrical signals. These electrical signals are amplified by an amplifier 3 which feeds them through a bandpass filter 4 to a detector circuit 5. The detected signals are fed to an integrating circuit 6 and the output of the circuit 6 is connected to a level detector 7 which produces a control signal at the output terminal 7*a*. The output control signal appearing at the terminal 7*a* is used, for example, for operating a motor within a television receiver to select a desired channel.

With reference now to FIGS. 2A–2E, in normal operation the transducer 2 often receives at least two kinds of signals. One is the control signal Ss produced by the transmitter 1 and the other type of signals are noise signals S*n* which have a frequency similar to that of the control signal. A source of such noise signals would be telephone bell, musical equipment or a squeaking door, for example.

These two types of signals S*s* and S*n* are amplified by the amplifier 3. The amplifier 3 is designed to operate at the limits of its gain characteristics so that it also acts as a signal limiter. Thus although the input signals Ss and Sn have different amplitudes as depicted in FIG. 2A the corresponding output signals T*s* and T*n* from the amplifier 3 have substantially the same amplitude as is depicted in FIG. 2B.

Figures 2A, 2B, 2C, 2D, 2E:
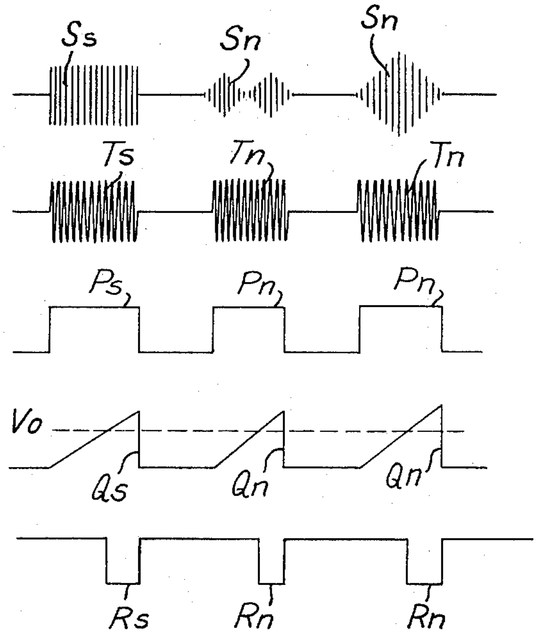
FIGS. 2A–2E are illustrative waveform diagrams for use in the description of the circuit of FIG. 1.

After detection by the circuit 5 the signals T*s* and T*n* are represented by the direct current pulse signals P*s* and P*n*, respectively, as depicted in FIG. 2C. These pulse signals are converted into saw-tooth wave shaped signals Q*s* and Q*n*, respectively, by the integrator circuit 6, which is typically a resistor-capacitor network. These saw-tooth signals are depicted in FIG. 2D and their peak amplitudes are compared in the level detector 7 with a predetermined voltage level Vo. The level detecting circuit 7 produces a control pulse representative of each saw-tooth shaped pulse whose amplitude exceeds the predetermined voltage level Vo as depicted in FIG. 2E.

Thus not only is a control signal pulse R*s* produced in response to the control signal S*s* but control signal pulses R*n* are produced in response to noise signals S*n* received by the receiver. This might have the undesired effect of changing the television channel or the misadjustment of the color balance by the remote control system within the television receiver due to such noise signals.

The present invention overcomes these problems by taking advantage of the phenomenon that such noise signals statistically vary greatly in their amplitude and duration in comparison with the control signals which have a substantially constant amplitude and a duration which is predetermined or which may be determined by the operator.

Figure 3:
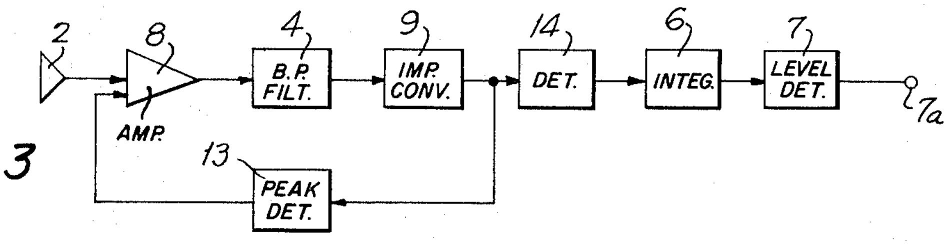
FIG. 3 is a block diagram of an ultrasonic signal receiver according to one embodiment of the invention.

These disadvantages are overcome by the present invention, one preferred embodiment of which is illustrated in FIG. 3. An electro-acoustic transducer 2 is connected to the input of an amplifier 8 of the variable gain type. The sound signals are converted by the transducer 2 into electrical signals and are then amplified by the amplifier 8. The amplified electrical signals are fed through a bandpass filter 4 which is tuned to the ultrasonic frequency of the control signal. The amplified and filtered electrical signals from the bandpass filter 4 are at a high impedance and they are converted by a circuit 9 into corresponding signals at a low impedance. The signals from the impedance converter 9 are fed to a detector circuit 14 having a threshold voltage level and to the input of a feedback, peak detector circuit 13.

As will be explained in greater detail with reference to FIG. 5, the feedback, peak detector circuit 13 produces a control signal which is inversely proportional to the peak amplitude of the amplified electrical signals appearing at the output of the circuit 9. The feedback signal decreases rapidly and substantially inversely as the amplitude of the signals from the circuit 9 to a value corresponding to the peak amplitude value of the amplified electrical signals, thereby clamping a peak amplitude of the amplified electrical signal to a first predetermined value. As the amplitude of the amplified electrical signal thereafter decreases the feedback control signal from the circuit 13 returns to its original value at a much slower rate thereby stabilizing the gain of the amplifier 8. In this case the original value is the value of the feedback control signal from the circuit 13 when no sound signal is received.

Figure 5:
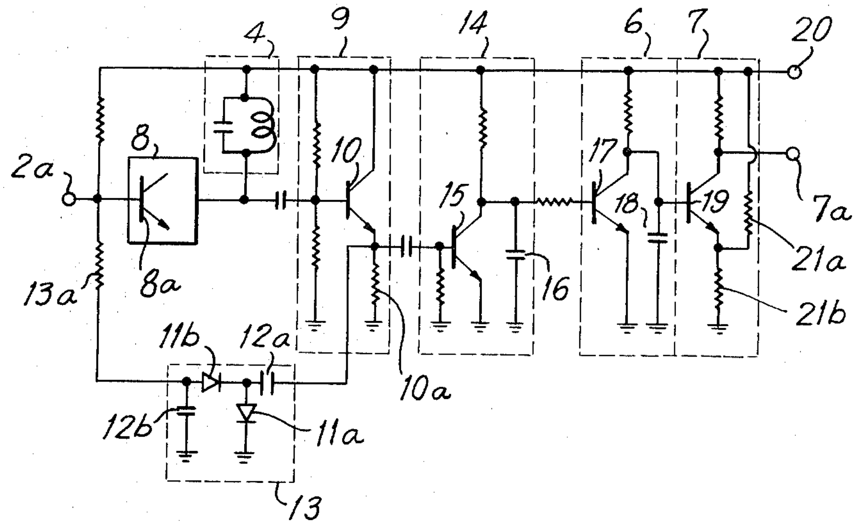
FIG. 5 is a detailed schematic diagram of the embodiment in FIG. 3.

With reference now to FIG. 5 the embodiment of FIG. 3 is shown in greater detail. The electrical signals from the transducer 2 are received at a terminal 2*a* which is the input to the transistor amplifier 8 having an NPN transistor 8*a*. The output from the amplifier 8 is filtered by means of a bandpass filter 4 connected in the collector bias circuit of the transistor 8*a* and comprised of a parallel capacitor and inductor circuit which is tuned to the frequency of the ultrasonic control signal. The filtered signal is fed to the base electrode of an NPN transistor 10 in the impedance converter 9 which is connected in an emitter follower configuration.

The amplified electrical signals appearing at an emitter load resistor 10*a* of the transistor 10 are fed through a capacitor 12*a* to the peak detector feedback circuit 13 comprised of a diode 11*a*, with its anode connected to one lead of the capacitor 12*a* and its cathode connected to the circuit ground, and a diode 11*b* with its cathode connected to the anode of the diode 11*a*, and a capacitor 12*b* connected between the circuit ground and the anode of the diode 11*b*. The anode of the diode 11*b* is also connected through a resistor 13*a* to the terminal 2*a*. The diodes 11*a* and 11*b* and the conductors 12*a* and 12*b* serve as a type of voltage doubler rectifier.

The circuit 13 provides a sort of negative feedback signal which is supplied to the base of the transistor 8*a*. Since the input of the feedback circuit 13 is connected to the low impedance output of the impedance converter 9 it has a short time constant for charging the capacitors 12*a* and 12*b* but since the; output of the feedback circuit 13 is connected to the relatively high impedance circuit of the input of the amplifier 8 it has a slow discharge time constant. Therefore the feedback signal supplied to the amplifier 8 varies substantially inversely as the amplitude of the electrical signal appearing at the emitter electrode of the transistor 10 until the peak amplitude of the signal is reached. Thereafter the negative feedback signal supplied by the circuit 13 returns to its original value at a relatively slow rate compared to the decrease in amplitude of the amplified electrical signal. This causes the amplifier 8 to have a relatively high gain in the absence of the feedback signal and an approximately constant gain for signals which have a lower amplitude level than the previous peak amplitude level of the amplified signal.

Figures 4A, 4B, 4C, 4D, 4E:
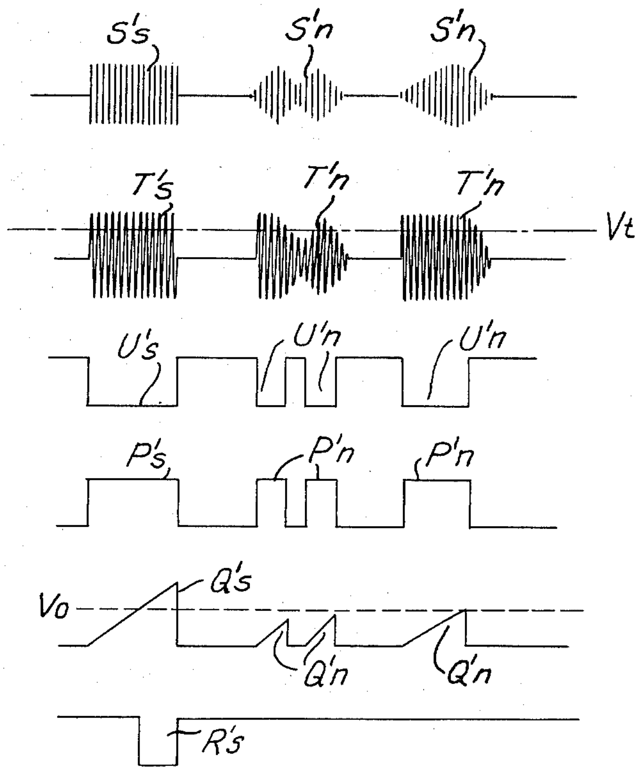
FIGS. 4A–4E are illustrative waveform diagrams for use in explaining the operation of the embodiment depicted in FIG. 3.

With reference now more particularly to FIG. 4A the waveforms of the sound signal S'*s* corresponding to the control signal and the noise signals S'*n* are illustrated. After amplification by the amplifier 8 and conversion to a lower impedance by the circuit 9 the signals are illustrated in FIG. 4A'. The peak amplitudes of the sound signal S'*s* and the noise signals S'*n* are clamped at a first predetermined peak voltage level by the operation of the peak detector feedback circuit 13. From this figure it is clear that the signal S'*s*, now designated T'*s*, has had its amplitude increased to exceed a second predetermined mined voltage level V*t*. The initial amplitude of the noise signals T'*n* has also been increased in its amplitude, however, the non-uniform amplitude characteristics of the signal *t'n* have been preserved.

When the first noise signal T'*n* initially reaches the amplifier 8 it has relatively small amplitude level and there is virtually no feedback control signal being supplied to the amplifier 8. Therefore the amplifier operates at a high gain and the output signal at that point is at the full amplitude capability of the amplifier 8. As the input noise signal S'*n* increases in amplitude to a peak value, the negative control signal supplied by the circuit 13 to the variable gain amplifier 8 likewise increases negatively to a peak value to decrease the gain of the amplifier 8. As the amplitude of the input noise signal S'*n* thereafter decreases in value the feedback signal slowly returns to its original value and the amplifier 8 operates in a substantially linear fashion so that the amplitude of the remainder of the amplified output signal T'*n* is representative of the amplitude of the remainder of the signal S'*n*. This remaining amplitude of the signal T'*n* falls below the predetermined voltage level V*t*.

With reference again to FIG. 5, the signals T's and T'*n* from the emitter electrode of transistor 10 are fed to the base electrode of an NPN transistor 15 in the detector circuit 14 having the voltage level V*t* as a threshold level. The voltage level V*t* is equal to the base-emitter junction voltage of the transistor (approximately 0.6 volts). A filtering capacitor 16 is connected across the output between the collector electrode and the emitter electrode of the transistor 15. When the amplitude of the input signal to the base of the transistor 15 exceeds the predetermined voltage level V*t*, the transistor 15 is turned "on" to become conductive and thereby to effectively produce a series of negative pulses U'*s* and U'*n*, shown in FIG. 4B, at its collector electrode. The pulses U'*s* and U'*n* correspond to those portions of the signals T'*s* and T'*n*, respectively, which exceed the voltage level V*t*. Thus for example the first noise signal T'*n* illustrated in FIG. 4A' produces two pulses U'*n* because its amplitude varies above and below the V*t* level.

These negative going pulses U'*s* and U'*n* are supplied to the base electrode of an NPN transistor 17 in the integrating circuit 6. A capacitor 18 is connected between the collector and emitter electrodes of the transistor 17 and the base electrode of an NPN transistor 19 level detector 7 is connected to the collector electrode of the transistor 17. An emitter bias resistor 21*b* is connected between the circuit ground and the emitter electrode of the transistor 19. A second bias resistor 21*a* is connected between a bias lead 20 and the emitter electrode of the transistor 19 so that together the resistors 21*a* and 21*b* form a voltage divider network. The output terminal 7*a* of the circuit 7 is connected to the collector electrode of the transistor 19. The transistors 8*a*, 10, 15, 17 and 19 are all connected to the bias lead 20 by appropriate biasing resistors which will not be described in detail since such circuitry is well known in the art.

In the absence of the capacitor 18 a series of positive pulses P'*s* and P'*n* (FIG. 4C) corresponding to negative pulses U'*s* and U'*n*, respectively, would be produced at the collector electrode of the transistor 17. However, due to the presence of the capacitor 18 the pulses are effectively integrated with respect to time to form saw-tooth shaped waves Q'*s* and Q'*n*, respectively. (FIG. 4D). The charge rate of the capacitor 18 is slow enough that the voltage which is applied to the base of the transistor 19 is substantially directly proportional to the duration of the negative pulse signals U'*s* and U'*n*. Thus since the negative pulse signals U'*s* is of a longer duration than the negative pulse signals U'*n* the amplitude of the saw-tooth shaped signal Q'*s* exceeds a third predetermined voltage level Vo whereas the amplitudes of the saw-tooth pulses Q'*n* do not exceed the voltage level V*o*.

The transistor 19 is biased in such a manner that it becomes saturated when the voltage applied to its base electrode is in excess of the voltage level Vo so that a negative going output pulse R'*s* appears at the terminal 7*a* which is representative of the signal Q'*s* and the original control signal S'*s* (FIG. 4E). The voltage level V*o* is equal to the voltage at the junction of the resistors 21*a* and 21*b* plus the base-emitter junction voltage of the transistor 19 (approximately 0.6 volts). The noise signals Q'*n* do not produce any corresponding control signals.

One advantage of the present invention is that by employing a relatively simple feedback gain control for the amplifier 8 it is unnecessary to provide an expensive, narrow bandpass filter 4 in order to eliminate noise signals. This allows the receiver to be constructed of less expensive materials than many prior art receivers of this type.

Figure 6:
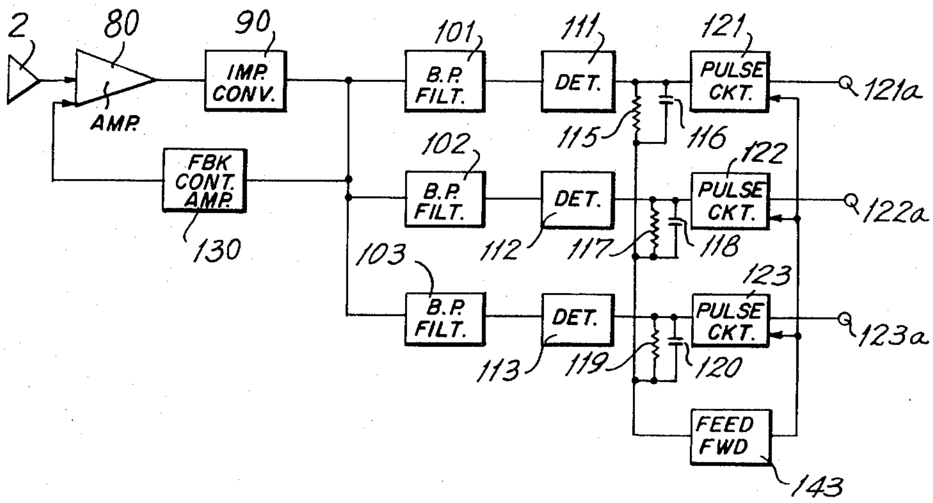
FIG. 6 is a block diagram of a second embodiment of the invention.

Referring now more particularly to FIG. 6 a second embodiment of the invention is illustrated. In this embodiment the transmitter (FIG. 7) transmits a plurality of control sound signals at different predetermined frequencies. For the purposes of this example the frequencies of three of the control signals are designated 40.0 KHz, 38.5 KHz and 37.0 KHz, respectively. The sound signals are converted by an electro-acoustic transducer 2 into electrical signals which are amplified by a bandpass amplifier 80 and are then fed to an impedance converter 90 which converts the signals from a relatively high impedance to a relatively low impedance. A feedback control circuit 130 is connected between the output of the circuit 90 and the input to the bandpass amplifier 80. The output signals from the circuit 90 are also fed to three separate bandpass filters 101, 102 and 103.

These bandpass filters separate the amplified electrical signals into signals having frequencies corresponding to 40.0 KHz, 38.5 KHz and 37.0 KHz, respectively. The separated signals are each then supplied to separate control circuit channels. Each of the bandpass filters 101, 102 and 103 is connected to the input of a separate detector circuit 111, 112 and 113, respectively. The detecting circuits rectify the separated amplified electrical signals to produce a series of corresponding direct current pulses which are then integrated by means of resistance-capacitance networks to produce saw-tooth shaped waves in a manner similar to the waves depicted in FIG. 4D.

These saw-tooth waves are fed to the separate inputs of output control pulse producing circuits 121, 122 and 123, respectively. As will be described in greater detail hereinafter, each of the output control pulse producing means operates under the separate control of a common feed forward circuit 143. The inputs to the circuit 143 is connected to the separate inputs of the circuits 121, 122 and 123 through the parallel resistor-capacitor circuits 115–116, 117–118 and 119–120, respectively. The feed forward control circuit is responsive to the duration of the saw-tooth shaped pulses supplied to the inputs of the circuits 121, 122 and 123. If the signals are not of a predetermined duration, any control pulse signal which would otherwise be produced in the circuits 121, 122 and 123 is blocked. A more detailed description of the operation of the embodiment of FIG. 6 will be given hereinafter in reference to FIG. 8.

Figure 7:
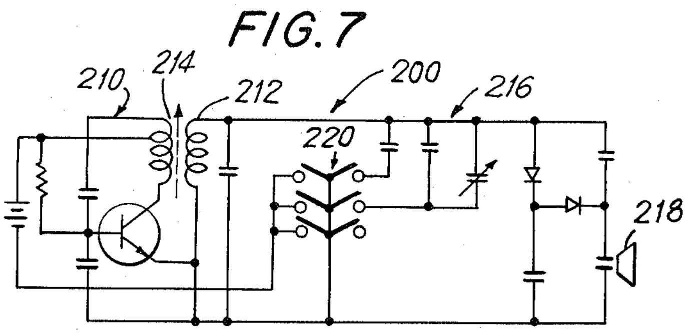
FIG. 7 is a detailed schematic diagram of an ultrasonic transmitter for use with the embodiment depicted in FIG. 6.

Referring now more particularly to FIG. 7 a transmitter suitable for use with the receiver depicted in FIG. 6 is illustrated. The transmitter is generally designated 200 and is comprised of a transistorized oscillator circuit 210. The inductance of a secondary winding 212 of a transformer 214 in the oscillator in combination with a plurality of separate capacitors 216 determines the frequency of the output signal to pass through an electro-acoustic transducer 218. The capacitors 216 may be selectively switched into the circuit by means of a multi-pole push button switch 220. The transmitter 200 has not been described in detail since it does not form an integral part of the invention and since any such ultrasonic oscillator producing an ultrasonic control sound signal would be suitable for use with the invention.

Figure 8:
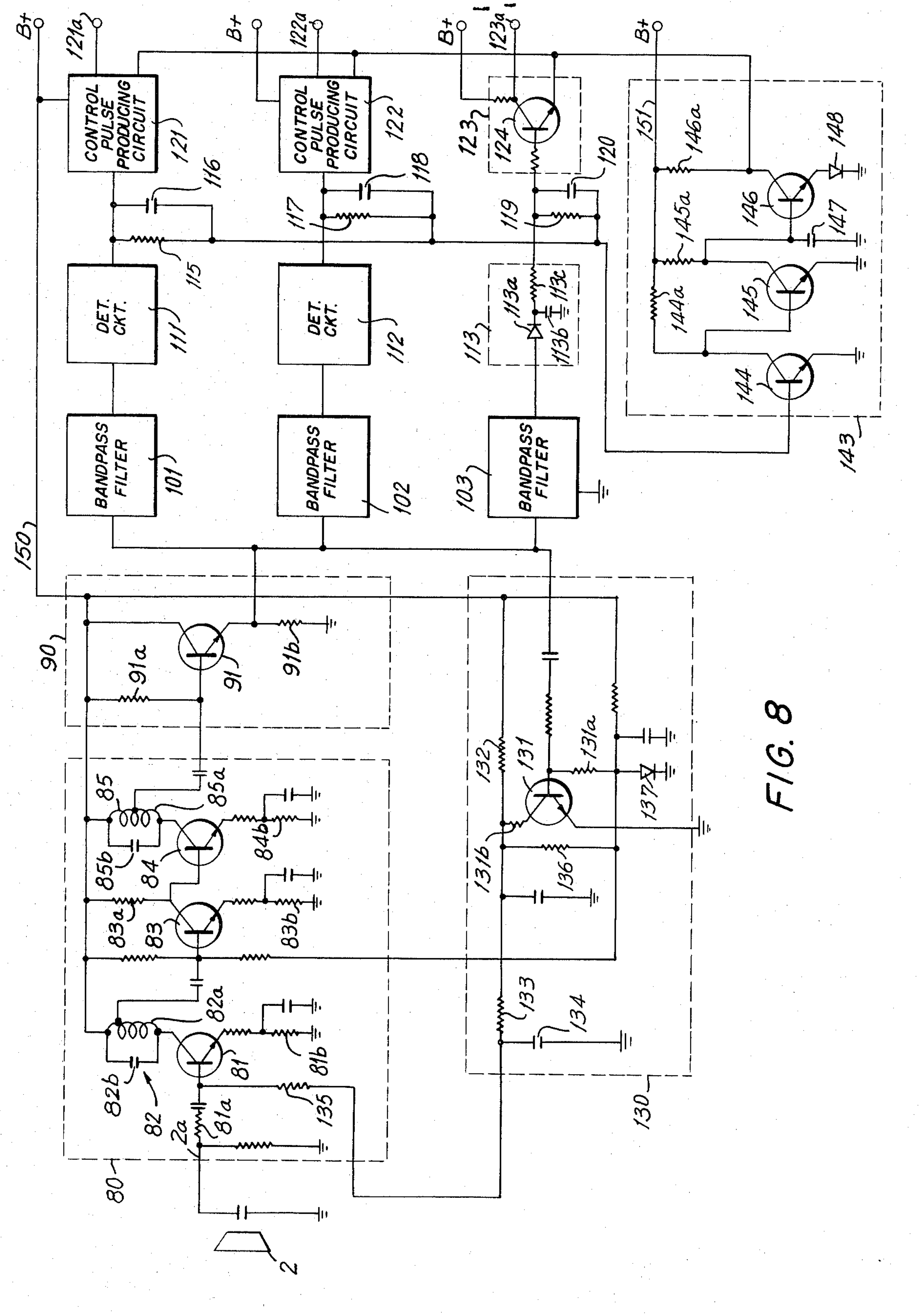
FIG. 8 is a detailed schematic diagram of the embodiment depicted in FIG. 6.

Referring now more particularly to FIG. 8 the embodiment depicted in FIG. 6 will be described in greater detail. The electro-acoustic transducer 2 is connected between the circuit ground and the input 2*a* of a bandpass amplifier generally designated 80. The bandpass amplifier 80 includes an NPN transistor 81 having its base electrode connected to the terminal 2*a* through suitable resistance and capacitance impedance matching devices 81*a*. The emitter electrode of the transistor 81 is connected through suitable biasing resistors 81*b* to the circuit ground and its collector electrode is connected through a tuned bandpass filter circuit 82 to a bias supply lead 150. The bandpass filter circuit 82 includes a coil 82*a* connected in parallel with a capacitor 82*b* and is designed to have a center bandpass frequency of 37.0 KHz. The output from the first transistorized amplifier 81 is taken from a tap on the coil 82*a*.

The output from the transistor 81 is fed to the base electrode of a second amplifying, NPN transistor 83 having its emitter electrode connected through an emitter biasing circuit 83*b* to the circuit ground. The collector electrode of transistor 83 is connected to the biasing lead 150 through a biasing resistor 83*a*. The output signals from the collector lead of the transistor 83 are fed directly to the base electrode of an NPN transistor 84. The emitter electrode of the transistor 84 is connected to the circuit ground through a suitable biasing network 84*b* and its collector electrode is connected to the biasing lead 150 through a bandpass circuit 85 comprised of a coil 85*a* in parallel with a capacitor 85*b*. The bandpass circuit is tuned to 41.5 KHz. The two bandpass circuits 82 and 85 establish the lower and upper frequency limits, respectively, of the amplifier 80.

The output signal from the transistor amplifier 84 is taken from a tap in the coil 85*a* and is fed to the base electrode of an NPN transistor 91 in the impedance converter circuit generally designated 90. The transistor 91 has a base biasing resistor 91*a* connected to the biasing lead 150 and an emitter load resistor 91*b* connected between the emitter lead and the circuit ground.

The amplified electrical signals representative of the sound control signals are fed from the emitter electrode of the transistor 91 to the base electrode of an NPN transistor 131 in the feedback circuit generally designated 130. The base electrode of the transistor 131 is supplied with a bias voltage through a suitable biasing circuit 131*a* and the transistor 131 has its emitter electrode connected directly to the circuit ground. The collector electrode is connected through a load resistor 131*b* and a high impedance resistor 132 to the bias lead 150. The junction of the resistors 131*b* and 132 is connected through a low impedance discharge resistor 133 to one lead of a storage capacitor 134 whose other lead is connected to the circuit ground. The junction of the resistor 133 and the capacitor 134 is connected through a resistor 135 to the base lead of the first transistor amplifier 81.

In operation, a positive biasing voltage to the base electrode of the transistor 81 is supplied from a voltage divider network comprised of the resistor 132 connected in series with a resistor 136 and a diode 137 between the positive bias lead 150 and the circuit ground. The cathode of the diode 137 is connected to the circuit ground and its anode is connected to the resistor 136. This bias voltage is fed from the junction of the resistors 132 and 136 through the resistor 133, which is connected in series with the resistor 135, to the base electrode of the When 81. When the amplitude of the alternating current signal present at the emitter electrode of the transistor 91 increases, the transistor 131 becomes more conductive thereby discharging the voltage stored on the capacitor 134 relatively quickly to the circuit ground. This has the effect of reducing the feedback bias voltage applied to the transistor 81 thereby reducing its gain and clamping a peak amplitude of the output signal of the impedance converter 90 at a predetermined value. After the amplified alternating current signal appearing at the emitter electrode of the transistor 91 decreases in amplitude, the capacitor 134 recharges slowly through the high value resistor 132. Thus the feedback bias voltage applied to the base electrode of the transistor 81 remains at a substantially reduced value for the period of time required to recharge the capacitor 134. In effect, this causes the transistor 81 to operate in a substantially linear manner after the peak amplitude of the alternating current voltage appearing at the electrode of the transistor 91 has passed.

The amplified alternating current signal appearing at the emitter electrode of the transistor 91 is also simultaneously fed to the three bandpass filters 101, 102 and 103, shown in block form in FIG. 8, which are tuned to the frequencies 40.0 KHz, 38.5 KHz, 37.0 KHz, respectively. The output from each of these bandpass filters is fed to a separate detecting circuit 111, 112 and 113, respectively. The outputs from the detecting circuits are fed to separate control pulse producing circuits 121, 122 and 123, respectively.

Thus each of the bandpass filters constitutes the input of a separate control signal channel. The corresponding circuits in each of the three channels are constructed in substantially the same manner and therefore a detailed description will be given only for the circuits connected to the bandpass filter 103, it being understood that the corresponding circuits in the other channels are constructed in substantially the same manner.

The detector circuit 113 connected to the output of the bandpass filter 103 includes a diode 113*a* having its anode electrode connected to the bandpass filter 103 and its cathode electrode connected to one lead of a capacitor 113*b* and one lead of a resistor 113*c*. The other lead of the capacitor 113*b* is connected to the circuit ground and the other lead of the resistor 113*c* is connected to the base of an NPN transistor 124 in the circuit 123. The alternating current signal representative of a sound control signal having a frequency of 37.0 KHz and an amplitude over the second predetermined voltage level V*t* which is equal to the anode-cathode junction voltage of the diode 113*a* (approximately 0.6 volts) is rectified by the diode 113*a* and the rectified voltage is smoothed by the capacitor 113*b* so that the signal passing through the resistor 113*c* to the circuit 123 constitutes positive going puluses P'*s* and P'*n* depicted in FIG. 4C corresponding to a control sound signal S' *s* and a noise signal S'*n* (FIG. 4A). The positive going pulses are also fed to the input of the feed forward control circuit 143, which is the base electrode of an NPN transistor 144 operating as an inverter-amplifier, through a resistor 119 connected in parallel with a capacitor 120. In a similar manner the base electrode also receives pulses from the detector circuit 111 through the resistor 115 connected in parallel with the capacitor 116 and from the detector 112 through the resistor 117 connected in parallel with the capacitor 118. The resistor-capacitor combinations are tuned to the respective bandpass filter frequencies.

The emitter of the transistor 144 is connected directly to the circuit ground and the collector electrode is connected through a biasing resistor 144*a* to a positive bias lead 151. The collector electrode of the transistor 144 is also connected to the base electrode of an NPN transistor 145 whose emitter electrode is connected directly to the circuit ground and whose collector electrode is connected through a resistor 145*a* to the bias lead 151.

The collector electrode of the transistor 145 is also connected directly to the base electrode of an NPN transistor 146 and to one lead of an integrating capacitor 147. The other lead of the capacitor 147 is connected to the circuit ground. The pulse signals depicted in FIG. 4C are inverted to become negative going pulses U'*s* and U'*n*, respectively, as depicted in FIG. 4B and which appear at the base electrode of the transistor 145.

The transistor 145 is normally biased to be in saturation and therefore substantially conductive. This places the voltage level at its collector lead at the collector-emitter saturation voltage of approximately 0.1 volts. During the negative going pulses depicted in FIG. 4B the transistor 145 becomes substantially non-conductive and the capacitor 147 is charged through the resistor 145*a* from the bias lead 151 to produce a corresponding saw-tooth shaped voltage at the base of the electrode of the transistor 146 as depicted in FIG. 4D. These saw-tooth shaped pulses Q'*s* and Q'*n* correspond to the original positive pulses P'*s* and P'*n*, respectively.

The transistor 146 has its emitter electrode connected to the anode electrode of a diode 148 whose cathode electrode is connected to the circuit ground. The collector electrode of the transistor 146 is connected through a bias resistor 146*a* to the bias lead 151 and is also connected directly to the emitter electrode of the transistor 124 in the circuit 123 and the corresponding emitter electrodes of the transistors in the circuits 121 and 122.

In the absence of the saw-tooth pulses depicted in FIG. 4D, the voltage appearing at the base electrode of the transistor 146 is the collector-emitter saturation voltage of the transistor 145 which is approximately 0.1 volts. The combined voltage drop across the base emitter junction of the transistor 146 and across the diode 148. is designated V*o*. Therefore the base of the transistor 146 is normally reverse biased and therefore the transistor 146 is substantially cut off and non-conducting. This causes the collector electrode of the transistor 146 to have a voltage value which is near to the voltage appearing at the lead 151 and also causes the transistor 124 to become cut off and substantially non-conducting.

When the amplitude of the saw-tooth shaped pulses applied to the base electrode of the transistor 146 exceed this predetermined voltage value V*o*, the transistor 146 becomes forwardly biased and conductive.

Statistically the noise signals are generally of a short duration compared to the normal duration of the control sound signal *s's*. With reference to FIG. 4D, the values of the capacitor 147 and the resistor 145*a* are chosen to have a charging rate such that the rate of integration of the signals depicted in FIG. 4C with respect to time will only allow the capacitor to charge to a voltage V*o* for signals having a duration longer than the probable duration of the noise signals.

The output signal at the collector electrode of the transistor 146 will be a negative going pulse R'*s* which is representative of that portion of the control signal pulse Q'*s* which exceeds the voltage V*o*. This negative going pulse R'*s* is applied to the emitter electrode of the transistor 124, as well as the corresponding emitter electrodes of the transistors in the circuits 121 and 122, allowing each such transistor to become conductive provided a positive pulse P'*s* is simultaneously applied to its base electrode. The output thus produced from the collector electrodes of the transistors which are connected to the output terminals 121*a*, 122*a* and 123*a*, will be negative going control pulses representative of the control signal pulses P'*s*. Thus each output amplifier, such as transistor 124, acts as form of AND gate for the control signal pulse P'*s* applied to its base and the signal R's from the feed forward control circuit 143 applied to its emitter.

Figure 9:
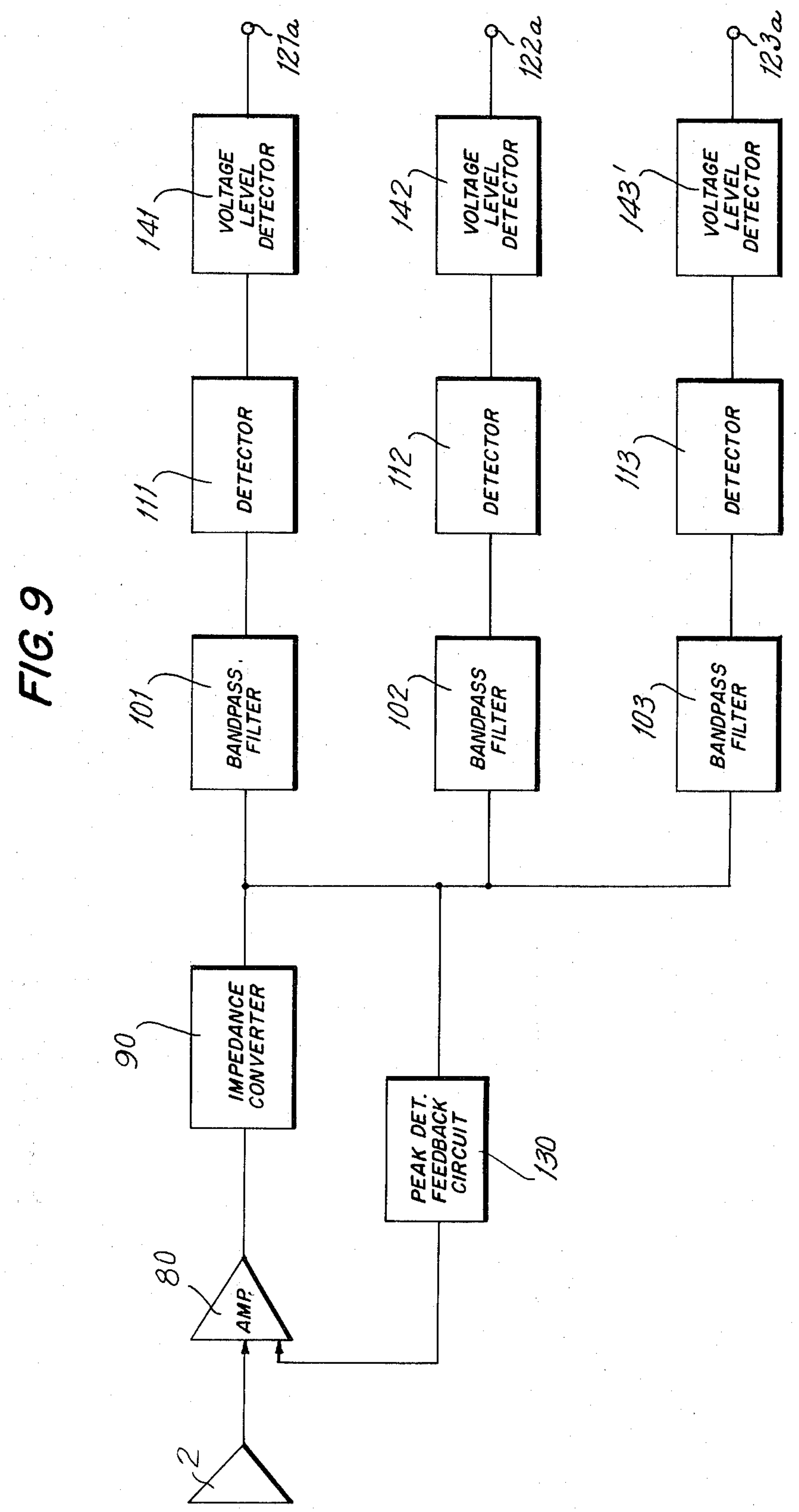
FIG. 9 is a block diagram of a modification of the embodiment of FIG. 6

One slight disadvantage of the embodiment of FIG. 6 is that in the unlikely event that a noise signal is received at one frequency simultaneously with a control signal at another frequency a spurious control pulse might be generated at the output terminals 12*a*–123*a*. This possibility may be safeguarded against by modifying the embodiment of FIG. 6 as illustrated in FIG. 10 to substitute spearate voltage level detectors 141, 142 and 143' for the circuits 121, 122 and 123, respectively, and to eliminate the circuit 143. The circuits 141, 142 and 143' are constructed and operate in substantially the same manner as the circuit 143 described in reference to the embodiment of FIG. 9.

In the embodiment of FIG. 10 each channel operates independently of the other channels and in a manner similar to that of the embodiment of FIG. 5 to distinguish between control and noise signals.

While in the above described embodiments transistors of a certain polarity have been described it should be apparent that in other embodiments transistors of the opposite polarity may also be utilized. Furthermore the specific transistorized circuits described may be replaced with integrated circuit components in still other embodiments.

The terms and expressions which have been employed here are used as terms of description and not of limitation, and there is not intention in the use of such terms and expressions, of excluding equivalents of the features shown and described, or portions thereof, it being recognized that various modifications are possible within the scope of the invention claimed.

What is claimed is:

1. A circuit for discriminating between sound signals, which are generated by a transmitter and which have at least one predetermined frequency, and noise signals, said circuit comprising:

A. electro-acoustic transducer means for converting the transmitted sound and the noise signals into electrical signals;
B. variable gain means for amplifying the electrical signals;
C. control means responsive to the amplified electrical signals for producing a controlling signal in response to the amplified signals, said control means being connected to said amplifying means to control the gain of the variable gain amplifying means, said control means comprising a time constant circuit having a shorter time constant and a slow discharge time constant;
D. means for converting the amplified electrical signals into corresponding direct current pulse signals whose durations are representative of the length of time that the amplitude of the amplified electrical signals is above a first predetermined voltage level;
E. means responsive to the integrated direct current pulse signals for producing output control signals representative of each integrated direct current pulse signal whose amplitude exceeds a second predetermined voltage level.

2. A circuit as recited in claim 1 wherein the gain control means comprises means for controlling the gain of the variable gain amplifying means inversely in proportion to the peak amplitude value of each amplified electrical signal.

3. A circuit as recited in claim 1 adpated to receive a plurality of sound signals at different predetermined frequencies and further comprising a plurality of bandpass filter means responsive to the amplified electrical signals for separating the amplified electrical signals according to the predetermined frequencies of the control sound signals and for feeding the separated amplified electrical signals to separate control channels.

4. A circuit as recited in claim 3 wherein separate output control signal producing means are provided for each control signal channel, and further including means responsive to the duration of the amplified electrical signal in each channel for preventing the output of control signals from the respective control signal producing means when the amplified electrical signal in the corresponding channel is not of a predetermined time duration.

5. A circuit as recited in claim 4 further comprising separate detecting circuits in each of the channels, each of the detecting circuits being separately responsive to the amplified electrical signals passed by the respective bandpass filter means for detecting the signals and for producing direct current pulses representative of the amplified electrical signals.

6. A circuit for discriminating between spurious signals and information signals, said information signals having an amplitude at least as great as a predetermined level and at least a predetermined duration at that amplitude and having at least one predetermined frequency, the spurious signals also including substantially the predetermined frequency but having an inconstant amplitude that drops below the predetermined level within a shorter time than said predetermined duration, said circuit comprising:

A. amplifier means for amplifying all of said signals;
B. control means responsive to the amplified signals for producing a control signal inversely proportional to the peak amplitude of the amplified signals, said control means being connected to said amplifier to control the gain of the amplifier means;
C. means for converting the information signals and the spurious signals into corresponding direct current pulse signals whose durations are representative of the duration of the separate portions of the electrical signals having amplitudes above said predetermined level;
D. means for integrating each of the direct current pulse signals with respect to time; and
E. means responsive to the integrated direct current pulse signals for producing output control signals representative of each integrated direct current pulse signal whose amplitude exceeds a second predetermined voltage level.

7. A circuit for discriminating between noise signals and sound signals generated by a transmitter and having at least one predetermined frequency, said circuit comprising:

A. an electro-acoustic transducer means for converting the transmitted sound signals into electrical signals;
B. variable gain means for amplifying the electrical signals;

C. feedback means responsive to the amplified electrical signals for controlling the gain of the variable gain amplifying means, said feedback control means including means for clamping the peak amplitude of the amplified electrical signals at a first predetermined level;

D. means for converting the amplified electrical signals into corresponding direct current pulse signals whose durations are representative of the duration of the separate portions of the amplified electrical signals having amplitudes above a second predetermined voltage level below said first predetermined voltage level;

E. means for integrating each of the direct current pulse signals with respect to time; and F. means responsive to the integrated direct current pulse signals for producing output control signals representative of each integrated direct current pulse signal whose amplitude exceeds a third predetermined voltage level.

* * * * *